(12) United States Patent
Zhao et al.

(10) Patent No.: US 10,793,948 B2
(45) Date of Patent: Oct. 6, 2020

(54) FILM FORMING APPARATUS WITH COVER WHICH MINIMIZES DEBRIS IN THE CHAMBER

(71) Applicant: BOE TECHNOLOGY GROUP CO., LTD., Beijing (CN)

(72) Inventors: Lihao Zhao, Beijing (CN); Biao Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 230 days.

(21) Appl. No.: 15/975,976

(22) Filed: May 10, 2018

(65) Prior Publication Data

US 2019/0062906 A1 Feb. 28, 2019

(30) Foreign Application Priority Data

Aug. 29, 2017 (CN) .......................... 2017 1 0757132

(51) Int. Cl.
*C23C 16/44* (2006.01)
*H01J 37/32* (2006.01)
*F16K 51/02* (2006.01)
*C23C 16/50* (2006.01)
*F16K 3/18* (2006.01)

(52) U.S. Cl.
CPC .......... *C23C 16/4409* (2013.01); *C23C 16/50* (2013.01); *F16K 3/186* (2013.01); *F16K 51/02* (2013.01); *H01J 37/32458* (2013.01); *H01J 37/32513* (2013.01); *H01J 37/32807* (2013.01)

(58) Field of Classification Search
CPC ........................ C23C 16/4409; H01J 37/32513
See application file for complete search history.

(56) References Cited

U.S. PATENT DOCUMENTS

| | | | | |
|---|---|---|---|---|
| 4,044,993 A | * | 8/1977 | Wheeler | F16K 51/02 251/158 |
| 2004/0089836 A1 | * | 5/2004 | Wu | F16K 3/0227 251/326 |
| 2004/0232369 A1 | * | 11/2004 | Kajitani | F16K 51/02 137/625.3 |
| 2005/0269031 A1 | * | 12/2005 | Tyler | H01J 37/32357 156/345.48 |
| 2007/0012251 A1 | * | 1/2007 | Zucker | C23C 16/4409 118/733 |
| 2011/0308464 A1 | * | 12/2011 | Kudoh | H01L 21/67017 118/728 |

(Continued)

*Primary Examiner* — Binu Thomas
(74) *Attorney, Agent, or Firm* — Calfee, Halter & Griswold LLP

(57) ABSTRACT

A film forming apparatus, including a base having a first chamber, an upper cover for at least covering an opening of the first chamber, and a first seal ring between the upper cover and the base, wherein the upper cover has an inclined slope, an orthographic projection of the slope in a plane where a bottom surface of the base is located overlaps with a region surrounded by an orthographic projection of the first seal ring in the plane where the bottom surface of the base is located, the orthographic projection of the slope is located is outside an orthogonal projection of the first chamber, and a portion of the slope close to the first chamber is away from the bottom surface of the base with respect to a portion of the slope away from the first chamber.

8 Claims, 3 Drawing Sheets

(56) References Cited

U.S. PATENT DOCUMENTS

2014/0106478 A1* 4/2014 Bang ............... C23C 16/455
                                                  118/719
2015/0179456 A1* 6/2015 Chen ............... C23C 16/4409
                                                  118/733

* cited by examiner

FILM FORMING APPARATUS WITH COVER WHICH MINIMIZES DEBRIS IN THE CHAMBER

CROSS REFERENCE

The present application claims the priority of Chinese Patent Application No. 201710757132.2, and filed on Aug. 29, 2017, and the entire contents thereof are incorporated herein by reference to serve as a portion of the present application.

TECHNICAL FIELD

The present disclosure relates to the field of display preparation technology, and in particular to a film forming apparatus.

BACKGROUND

A basic principle of PECVD (Plasma Enhanced Chemical Vapor Deposition) is to input direct current, high frequency or microwave power in a raw gas that maintains a certain pressure, to generate gas discharge, and to form a plasma, thereby greatly enhancing chemical activity of the reaction gas, achieving the purpose of depositing a thin film, and forming a film at a lower temperature.

It should be noted that, information disclosed in the above background portion is provided only for better understanding of the background of the present disclosure, and thus it may contain information that does not form the prior art known by those ordinary skilled in the art.

SUMMARY

The present disclosure provides a forming apparatus, including a base having a first chamber, an upper cover for at least covering an opening of the first chamber, and a first seal ring between the upper cover and the base, wherein the upper cover has an inclined slope, an orthographic projection of the slope in a plane where a bottom surface of the base is located overlaps with a region surrounded by an orthographic projection of the first seal ring in the plane where the bottom surface of the base is located, the orthographic projection of the slope in the plane where the bottom surface of the base is located is outside an orthogonal projection of the first chamber in the plane where the bottom surface of the base is located, and a portion of the slope close to the first chamber is away from the bottom surface of the base with respect to a portion of the slope away from the first chamber.

In an optional implementation, the orthographic projection of the first seal ring in the plane where the bottom surface of the base is located is outside a region surrounded by the orthographic projection of the slope in the plane where the bottom surface of the base is located, the film forming apparatus further includes: a second seal ring located between the upper cover and the base, and the orthographic projection of the slope in the plane where the bottom surface of the base is located completely covers an orthogonal projection of the second seal ring in the plane where the bottom surface of the base is located.

In an optional implementation, both the first seal ring and the second seal ring are O-shape seal rings.

In an optional implementation, an edge of the upper cover is provided with at least one first electromagnet, and an edge of the base is provided with a second electromagnet in one-to-one correspondence to the first electromagnet, wherein the first electromagnet and the second electromagnet is attracted mutually after being energized for connecting the upper cover and the base.

In an optional implementation, a cross-sectional diameter of the second seal ring is greater than that of the first seal ring.

In an optional implementation, an included angle between the slope and the plane where the bottom surface of the base is located is greater than or equal to 1 degree and less than or equal to 5 degrees.

In an optional implementation, both the first seal ring and the second seal ring are located on the base.

In an optional implementation, the film forming apparatus further includes:
a vacuum adsorption device;
a dust suction groove arranged on the base, wherein the dust suction groove is located between the first seal ring and the second seal ring;
a transmission channel provided on the base, wherein one end of the transmission channel is communicated with a groove bottom of the dust suction groove and the other end of the transmission channel is communicated with the vacuum adsorption device.

In an optional implementation, the film forming apparatus further includes:
a first power supply device, for supplying a current to the first electromagnet; and
a second power supply device, for supplying a current to the second electromagnet.

In an optional implementation, the second electromagnet is located between the first seal ring and the second seal ring.

DETAILED DESCRIPTION

The following will clearly and completely describe the technical solutions in the embodiments of the present disclosure with reference to the accompanying drawings in the embodiments of the present disclosure. Apparently, the described embodiments are merely a part of the embodiments of the present disclosure and not all of the embodiments. All other embodiments obtained by a person of ordinary skill in the art based on the embodiments of the present disclosure without creative efforts shall fall within the protection scope of the present disclosure.

Figure 1:
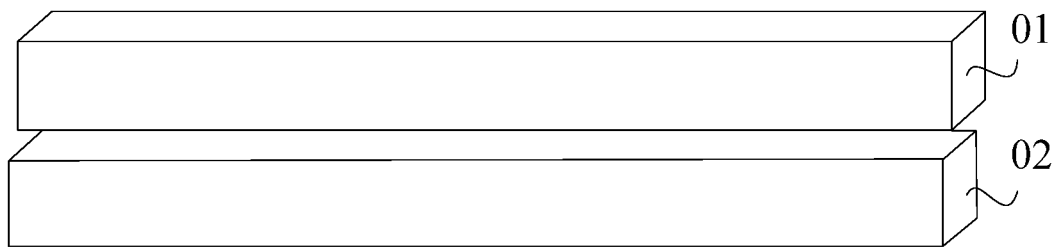
FIG. 1 is a partial schematic view of a film forming apparatus.
Figure 2:
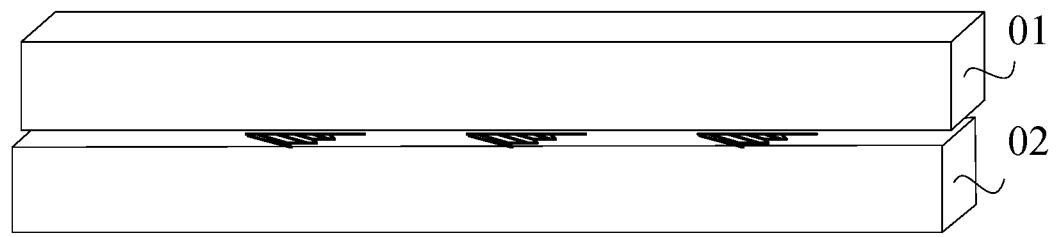
FIG. 2 is a schematic view of wear of a film forming apparatus.

As shown in FIG. 1, an existing film forming apparatus mainly includes: an upper cover 01 having a first chamber 21 and a base 02 having a second chamber 11. When the upper cover 01 covers the base 02, the first chamber 21 and the second chamber 11 form a reaction chamber. The upper cover of the film forming apparatus needs to be opened for cleaning and maintenance after depositing the thin film for a period of time. Each time the cover is closed, it is necessary to repeatedly align the upper cover and the base, to ensure that the upper cover accurately covers the base. However, repeated alignment will cause an edge of the upper cover to rub against an edge of the base to generate wear (as shown in FIG. 2), thus generating debris. The debris will pollute the reaction chamber and decrease film formation quality.

Figure 3:
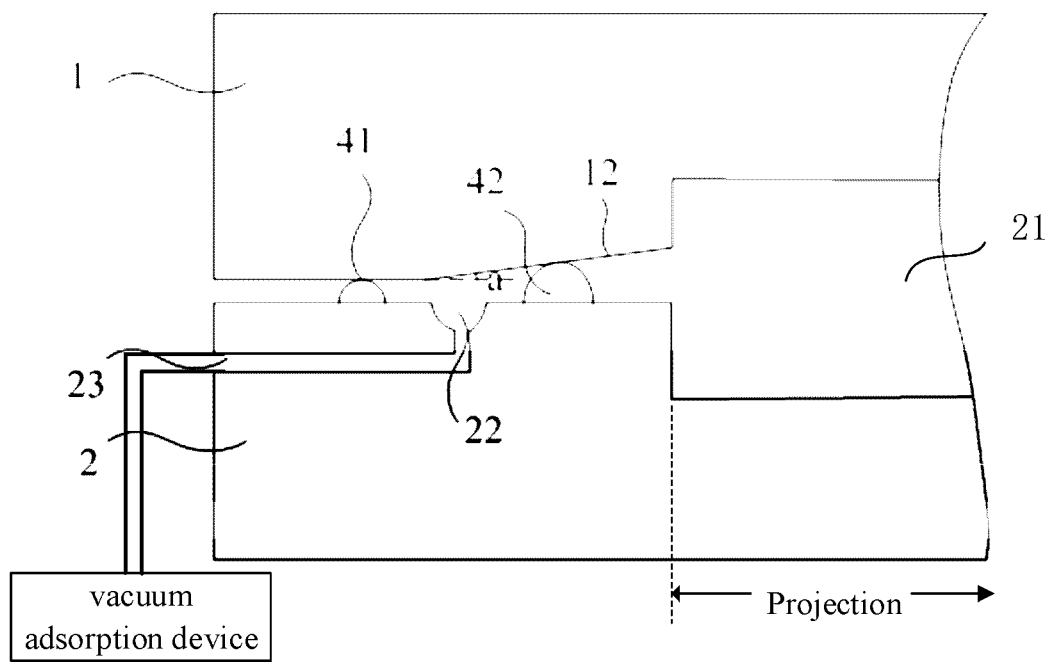
FIG. 3 is a schematic partial structural view of a film forming apparatus provided by an embodiment of the present disclosure.

As shown in FIG. 3, the present disclosure provides a film forming apparatus, including: a base 2 having a first chamber 21, an upper cover 1 for at least covering an opening of the first chamber 21, and a first seal ring 41 between the upper cover 1 and the base 2, wherein the upper cover 1 has an inclined slope 12, an orthographic projection of the slope 12 in a plane where a bottom surface of the base 2 is located overlaps with a region surrounded by an orthographic projection of the first seal ring 41 in the plane where the bottom surface of the base 2 is located, the orthographic projection of the slope 12 in the plane where the bottom surface of the base 2 is located is outside an orthogonal projection of the first chamber 21 in the plane where the bottom surface of the base 2 is located, and an end of the slope 12 close to the first chamber 21 is away from the bottom surface of the base 2 with respect to a portion of the slope 12 away from the first chamber 21.

The film forming apparatus provided by the present disclosure can play a seal connection role between the upper cover 1 and the base 2 through the provided first seal ring 41, and can well block foreign impurities or debris generated due to the wear of portions of the upper cover 1 and the base 2 located at periphery of the first seal ring 41. In addition, since the upper cover 1 is provided with the slope 12, the orthographic projection of the slope 12 in a plane where a bottom surface of the base 2 is located overlaps with a region surrounded by an orthographic projection of the first seal ring 41 in the plane where the bottom surface of the base 2 is located, and an end of the slope 12 close to the first chamber 21 is away from the bottom surface of the base 2 with respect to an end of the slope 12 close to the seal ring 41, portions of the upper cover 1 and the base 2 located within the first seal ring 41 will not be easily worn and generate debris even if the first seal ring 41 is worn or deformed.

Therefore, the film forming apparatus provided by the present disclosure can reduce the generation of friction debris, thereby reducing the pollution of the reaction chamber caused by debris, and improving the film formation quality.

The specific structure of an orthographic projection of the slope in a plane where a bottom surface of the base is located overlapping with a region surrounded by an orthographic projection of the first seal ring in the plane where the bottom surface of the base is located includes: the orthographic projection of the first seal ring in the plane where the bottom surface of the base is located is outside a region surrounded by the orthographic projection of the slope in the plane where the bottom surface of the base is located; or a region surrounded by the orthographic projection of the slope in the plane where the bottom surface of the base is located completely covers a region surrounded by an orthogonal projection of the first seal ring in the plane where the bottom surface of the base is located. In the perspective view, the first seal ring is located below the slope.

Figure 4:
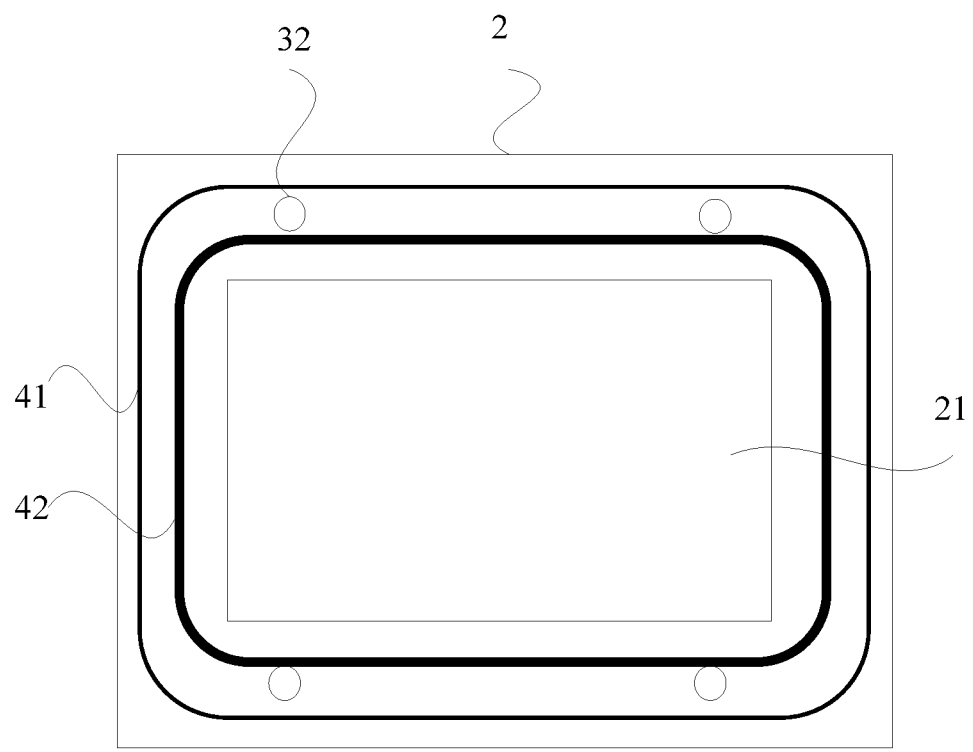
FIG. 4 is a schematic structural diagram of a base provided by an embodiment of the present disclosure.

In an optional embodiment, as shown in FIG. 4, the orthographic projection of the first seal ring 41 in the plane where the bottom surface of the base 2 is located is outside a region surrounded by the orthographic projection of the slope 12 in the plane where the bottom surface of the base 2 is located, the above film forming apparatus further includes: a second seal ring 42 located between the upper cover 1 and the base 2, and the orthographic projection of the slope 12 in the plane where the bottom surface of the base 2 is located completely covers an orthogonal projection of the second seal ring 42 in the plane where the bottom surface of the base 2 is located. The seal ring is set to be a two-layer structure, which can improve the seal effect.

The specific shapes of the first seal ring 41 and the second seal ring 42 may be various. Optionally, both the first seal ring 41 and the second seal ring 42 are O-shape seal rings.

Figure 5:
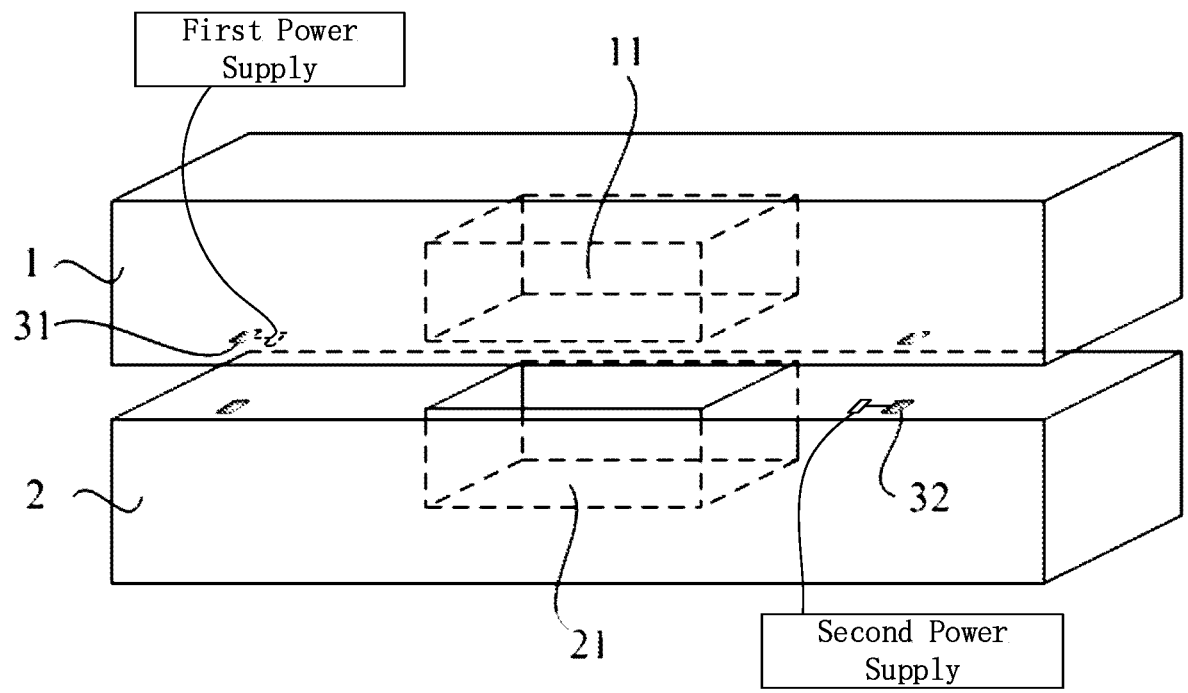
FIG. 5 is a schematic diagram of a perspective structure of a film forming apparatus provided by an embodiment of the present disclosure.
Figure 6:
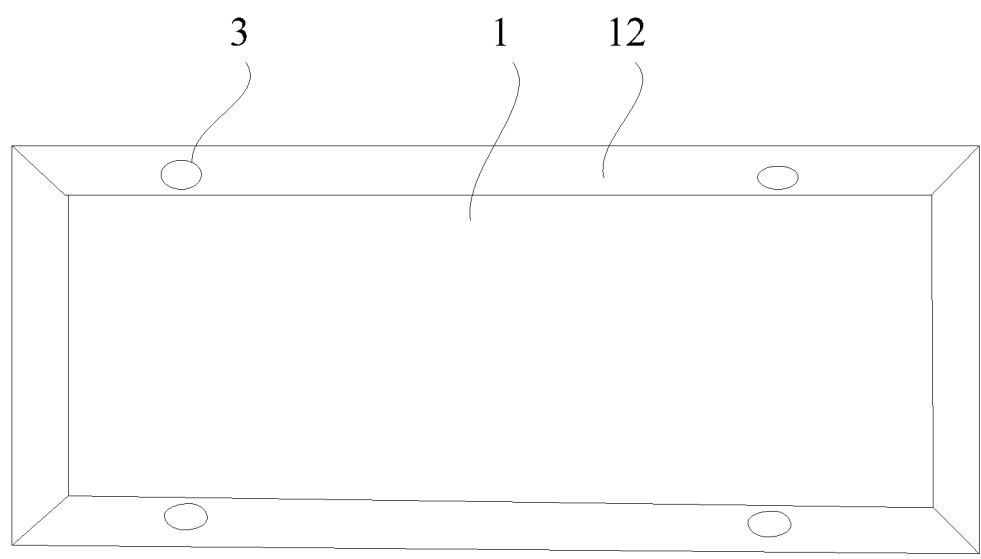
FIG. 6 is a schematic structural view of an upper cover provided by an embodiment of the present disclosure.

As shown in FIG. 5 and FIG. 6, an edge of the upper cover 1 is provided with at least one first electromagnet 31; and an edge of the base 2 is provided with a second electromagnet 32 in one-to-one correspondence to the first electromagnet 31, wherein the first electromagnet 31 and the second electromagnet 32 attract each other after being energized. The upper cover 1 at least covers an opening of the second chamber provided on the base 2. When the upper cover 1 covers the base 2, the first chamber 21 and the second chamber 11 form a reaction chamber. The alignment and connection of the upper cover 1 and the base 2 may be conveniently achieved through the first electromagnet 31 provided on the upper cover 1 and the second electromagnet 32 provided on the base 2. The first electromagnet 31 and the second electromagnet 32 attract each other after being energized and will assist the alignment of the upper cover 1 and the base 2, which can relieve the wear phenomenon caused by repeated abrasion when the upper cover 1 and the base 2 are aligned, reduce the generation of friction debris, in turn reduce the pollution of the reaction chamber caused by debris, and improve the film formation quality.

When the closing of the chamber is performed, after the upper cover 1 descends to a certain position and performs a rough alignment in advance, the first electromagnet 31 and the second electromagnet 32 generate magnetism after being energized, and the generated attraction assists the alignment of the upper cover 1 and the base 2, which may effectively prevent the mutual wear phenomenon caused by re-movement after being contacted.

The first electromagnet 31 may be embedded in the upper cover 1 or may be attached to a surface of the upper cover 1. Correspondingly, the second electromagnet 32 may be embedded in the base 2, or may be attached to a surface of the base 2.

As shown in FIG. 5, the upper cover 1 may also have a second chamber 11.

After the first chamber and the second chamber are closed, a reaction chamber is formed.

In an optional embodiment, a cross-sectional diameter of the second seal ring 42 is greater than that of the first seal ring 41. Due to the presence of the slope 12, the second seal ring 42 corresponding to the slope 12 is set thicker, which can improve the seal effect.

As shown in FIG. 3, in the film forming apparatus provided by the present disclosure, an included angle a between the slope 12 and the plane where the bottom surface of the base 2 is located is greater than or equal to 1 degree and less than or equal to 5 degrees. Optionally, the angle of inclination may be 1 degree, 1.2 degrees, 2 degrees, 2.5 degrees, 3 degrees, 3.5 degrees, 4 degrees, 5 degrees, etc., and repeated description thereof will not be provided here one by one.

The first seal ring 41 and the second seal ring 42 may be arranged in various positions. Optionally, both the first seal ring 41 and the second seal ring 42 are located on the base 2.

In order to further improve the cleanliness of the reaction chamber, the film forming apparatus further includes:
  a vacuum adsorption device;
  a dust suction groove 22 arranged on the base 2, wherein the dust suction groove 22 is located between the first seal ring 41 and the second seal ring 42;
  a transmission channel 23 provided on the base 2, wherein one end of the transmission channel 23 communicates with a groove bottom of the dust suction groove 22 and the other end of the transmission channel 23 communicates with the vacuum adsorption device. The vacuum adsorption device can inhale impurities due to the aging of the seal ring and improve the cleanliness of the reaction chamber.

The specific structure of the above vacuum adsorption device can be various. Optionally, the vacuum adsorption device is a pumping cylinder.

The specific installation position, size, shape, and the like of the dust suction groove 22 can be set by those skilled in the art according to actual needs. Optionally, the dust suction groove 22 is disposed around the periphery of the first seal ring 41.

A specific position of the second electromagnet 32 on the base 2 may also be various. Optionally, as shown in FIG. 4, the second electromagnet 32 is located between the first seal ring 41 and the second seal ring 42. Of course, the specific number of the second electromagnet 32 and the first electromagnetic component 31 is also not limited, which may be two, three, or the like.

In an embodiment provided by the present disclosure, the film forming apparatus further includes:
  a first power supply device, for supplying a current to the first electromagnet 31; and
  a second power supply device, for supplying a current to the second electromagnet 32. The separately provided power supply devices may facilitate the connection and achieve a simple structure.

The specific shapes of the first electromagnet 31 and the second electromagnet 32 may be various. Optionally, the first electromagnet 31 and the second electromagnet 32 may both be cylindrical or both be rectangular, or may be partially cylindrical and partially rectangular, which will not be repeatedly described herein.

It will be apparent to those skilled in the art that various modifications and variations can be made to the present disclosure without departing from the spirit and scope of the present disclosure. In this way, if these modifications and variations of the present disclosure belong to the scope of the claims of the present disclosure and their equivalent technologies, the present disclosure also intends to include these modifications and variations.

What is claimed is:

1. A film forming apparatus, comprising:
  a base having a first chamber;
  an upper cover for at least covering an opening of the first chamber; and
  a first seal ring between the upper cover and the base,
  wherein the upper cover has an inclined slope, an orthographic projection of the inclined slope in a plane where a bottom surface of the base is located overlaps with a region surrounded by an orthographic projection of the first seal ring in the plane where the bottom surface of the base is located, the orthographic projection of the inclined slope in the plane where the bottom surface of the base is located is outside an orthogonal projection of the first chamber in the plane where the bottom surface of the base is located, and a portion of the inclined slope close to the first chamber is away from the bottom surface of the base with respect to a portion of the inclined slope away from the first chamber,
  wherein the orthographic projection of the first seal ring in the plane where the bottom surface of the base is located is outside a region surrounded by the orthographic projection of the inclined slope in the place where the bottom surface of the base is located, the film forming apparatus further comprises: a second seal ring located between the upper cover and the base, and the orthographic projection of the inclined slope in the plane where the bottom surface of the base is located completely covers an orthogonal projection of the second seal ring in the plane where the bottom surface of the base is located, and
  wherein an edge of the upper cover is provided with at least one first electromagnet, and an edge of the base is provided with a second electromagnet in one-to-one correspondence to the first electromagnet, wherein the first electromagnet and the second electromagnet are attracted mutually after being energized for connecting the upper cover and the base.

2. The film forming apparatus according to claim 1, wherein both the first seal ring and the second seal ring are O-shape seal rings.

3. The film forming apparatus according to claim 2, wherein a cross-sectional diameter of the second seal ring is greater than that of the first seal ring.

4. The film forming apparatus according to claim 1, wherein an included angle between the inclined slope and the plane where the bottom surface of the base is located is greater than or equal to 1 degree and less than or equal to 5 degrees.

5. The film forming apparatus according to claim 1, wherein both the first seal ring and the second seal ring are located on the base.

6. The film forming apparatus according to claim 5, further comprising:
  a vacuum adsorption device;
  a dust suction groove arranged on the base, wherein the dust suction groove is located between the first seal ring and the second seal ring; and
  a transmission channel provided on the base, wherein one end of the transmission channel is communicated with a groove bottom of the dust suction groove and the other end of the transmission channel is communicated with the vacuum adsorption device.

7. The film forming apparatus according to claim 1, further comprising:
  a first power supply device, for supplying a current to the first electromagnet; and
  a second power supply device, for supplying a current to the second electromagnet.

8. The film forming apparatus according to claim 1, wherein the second electromagnet is located between the first seal ring and the second seal ring.

* * * * *